United States Patent [19]

Rowlette et al.

[11] Patent Number: 5,173,843
[45] Date of Patent: Dec. 22, 1992

[54] FAN CONTROL AND DIODE INTERLOCK FOR ELECTRIC HEATERS

[75] Inventors: Mitchell R. Rowlette, Berea; Kenneth L. Hayden, Bardstown, both of Ky.; Gary J. Steffes, Monroe, Mich.

[73] Assignee: Texas Instruments Incorporated, Dallas, Tex.

[21] Appl. No.: 580,747

[22] Filed: Sep. 11, 1990

[51] Int. Cl.$^5$ ............................................. H05K 1/18
[52] U.S. Cl. .................................. 361/406; 335/202; 361/94; 439/366; 439/720
[58] Field of Search ................... 174/260; 439/62, 66, 439/78, 366, 620, 621, 622; 335/202; 338/22 R; 361/94, 104, 105, 331, 380, 397, 400, 405, 413, 430, 432, 404, 406; 336/192

[56] References Cited

U.S. PATENT DOCUMENTS

| | | | |
|---|---|---|---|
| 1,254,067 | 6/1917 | Platt | 361/430 |
| 2,504,804 | 4/1950 | Clarke | 337/215 |
| 2,813,265 | 11/1957 | Finks | 439/366 |
| 2,981,897 | 4/1961 | Beggs | 439/366 |
| 3,171,002 | 2/1965 | Kinnear | 439/366 |
| 4,400,674 | 8/1983 | Suda | 336/192 |
| 4,533,889 | 8/1985 | Knight | 361/400 |
| 4,823,235 | 4/1989 | Suzuki | 361/424 |
| 4,938,715 | 7/1990 | Jones | 361/430 |
| 5,007,844 | 4/1991 | Mason | 439/68 |

Primary Examiner—Gerald P. Tolin
Attorney, Agent, or Firm—Russell E. Baumann; René E. Grossman; Richard L. Donaldson

[57] ABSTRACT

A fan control board and circuit having a central low voltage wiring center as well as a safety interlock for electric heater in which the interlock uses diodes to ensure proper fan operation in the event of miswiring of the heater sequencers. Another feature of the invention is a quick connect for a time delay of the circuit which permits easy insertion and removal thereof for replacement and/or cleaning.

3 Claims, 4 Drawing Sheets

FAN CONTROL AND DIODE INTERLOCK FOR ELECTRIC HEATERS

BACKGROUND OF THE INVENTION

1. Field of the Invention

This invention relates to a fan motor control and interlock circuit, primarily for use in conjunction with electric heaters including electric heat pumps.

2. Brief Description of the Prior Art

In accordance with the prior art, 24 volt AC coil relays were used to control the fan motors for electric furnaces including electric heat pumps. AC coil relays are more expensive than DC coiled relays and consume much less power than DC coil relays, therefore making it desirable to utilize less expensive circuitry. It is also desirable to utilize a printed circuit board to eliminate loose wires and the like which tend to cause problems. Furthermore, in the instance where many stages of electric heat would be employed, special care had to be given to the proper control wiring for each electric heat sequencer; or alternately, an "interlock" relay had to be used to insure that the first stage of electric heat was energized when the second or third stage was energized. If one of these two methods were not employed, an unsafe condition could occur in that an electric heater could be energized without the fan motor being powered.

SUMMARY OF THE INVENTION

In accordance with the present invention, there is provided a fan control board having a central low voltage wiring center as well as a safety interlock for electric heaters whereby the above noted desired results are accomplished. The fan control board includes a field wiring block, a relay, quick connects, a connector and an array of diodes. The relay is a single pole double throw (SPDT) relay capable of handling high current and is designed to be mounted on a printed circuit board.

The fan control board replaces the discrete components associated with a fan coil unit in an air conditioning/heat pump system. Since the fan control board combines all of these functions in a single circuit board, much of the wiring normally required in a fan coil unit is eliminated. Furthermore, the fan control board uses a low cost DC relay rather than the standard 24 VAC fan relay. Quick connects for the fan, transformer, electronic air cleaner, fan time delay and optional two speed fan option are also provided via the printed circuit board. The field wiring block is a printed circuit board mounted terminal board that is attached so that when installed in the fan coil unit it maintains the same appearance and location as the terminal block used in the standard fan coil unit. Breakaway jumper wires incorporated into the printed circuit board gives the assembly the flexibility to be used in a wide variety of electric furnace configurations.

The invention also incorporates an electric heat interlock which uses diodes to insure proper fan operation in the event of miswiring of the heater sequencers. This safety feature insures that regardless of how the service technician wires the fan control board, the fan will be turned on when any of the electric heating elements are energized. This is accomplished at a significant cost reduction over the conventional method of using a separate relay. The reduced load requirement of the diode array, also makes it possible to reduce the transformer from a 60 VA to a 40 VA, thus reducing the cost associated with the transformer.

Another unique feature of this invention is a quick connect for the time delay relay which permits easy installation of a fan delay option or replacement.

Briefly, in accordance with a first feature of the present invention, diode circuits are provided in both the circuit to normally power the fan relay as well as in the circuit to power the PTC resistor of a time delay relay which closes the electric heat circuit with the circuit which powers the fan motor also being connected across the electric heater circuit to provided power to the fan circuit and permit the fan motor to turn on concurrently with the application of power to the PTC resistor, thereby avoiding the possibility of the heater being turned on prior to the fan.

In accordance with a second feature of the present invention, circuitry to control each of multiple heater elements is also applied via rectification circuitry to the fan motor circuitry to cause operation of the fan motor regardless of the order of operation of the heater elements of a furnace.

In accordance with a third feature of the present invention, there is provided a quick connect and time delay relay design to allow easy insertion and removal of the relay for replacement or selection of a different time delay. This is provided by having three spaced contacts on the housing surface of the relay with the quick connect having a resilient C-shaped terminal for frictionally locking one of the relay contacts therein and a pair of terminals at opposite ends thereof, at least one being resilient for contacting the other contacts on the housing.

DESCRIPTION OF THE PREFERRED EMBODIMENT

Figure 1:
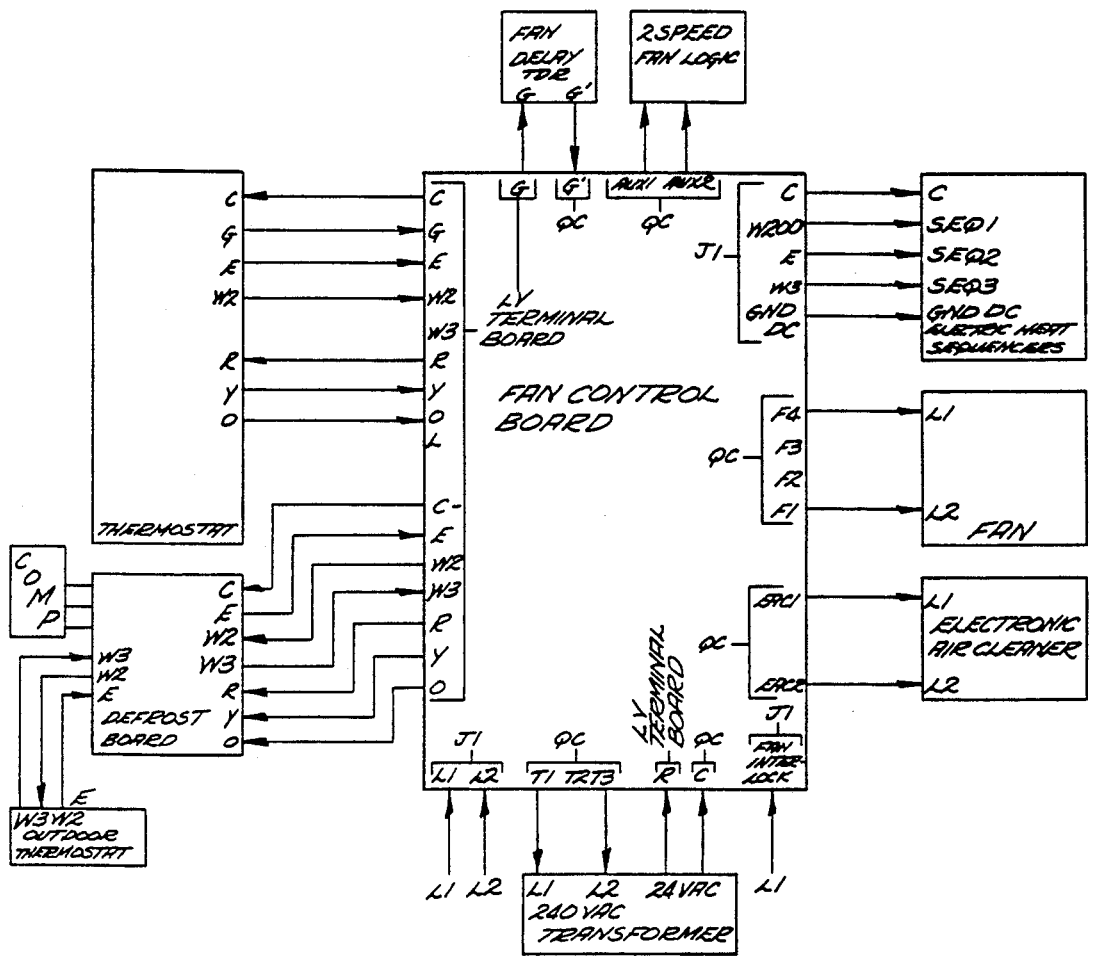
FIG. 1 is a block diagram of a control system for an electric heating system including the present invention.

Referring first to FIG. 1, there is shown a block diagram of a heating system including the circuit in accordance with the present invention. The system includes a fan control board which includes the circuit of the present invention as a part thereof. Connected to the fan control board at terminals G,G' is a fan time delay relay which is powered by the 24 VAC from the transformer connected to the fan control board at terminals R,C and delays operation of the fan. The two speed fan logic is an optional circuit to control fan speed. The electric heat sequencers receive signals from the fan control board at terminals C, W2DC, E, W3 and GNDDC and energize the various heating stages of the electric heater in appropriate sequence. The quick connects (QC) F1, F2, F3 and F4 on the fan control board are coupled to the fan or blower motor relay to drive the fan for the heater. The quick connects (QC) EAC1 and EAC2 control the electronic air cleaner. The fan interlock (J1) (later denoted as ACINTLK) is a common to the first stage electric heater. The 24 VAC transformer is powered by 240 VAC line current via terminals T1, T2 and T3 and provides 24 volts to the fan control board at inputs R and C thereof. The line current is applied to the fan control board via inputs L1 and L2 thereof. The defrost board and outdoor thermostats are located in the heat pump and the interior thermostats are located in the space to be heated and provide to and receive various low voltage signals for the fan control board to operate in response to an indoor and/or outdoor thermostat and a compressor. The signals to and from the fan control board to the thermostat and defrost board are shown in FIG. 1 and are the same as signals which will be referred to later herein.

Figure 2:
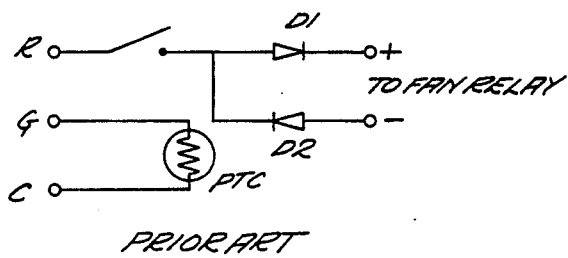
FIG. 2 is a circuit diagram of a typical prior art time delay relay.

FIG. 2 is a schematic diagram of a time delay relay of the type used in the prior art to allow a fan motor to be turned on and be delayed in being turned off in order to increase furnace efficiency by removing the latent heat built up in the coil and other heater structures. When a controller, such as a thermostat, provides a signal to turn on the fan motor, the 24 volts AC is applied across terminals G and C to power the PTC resistor. When the PTC resistor reaches a predetermined temperature, the 1NT contact closes and connects terminal R, which is one side of the 24 volt AC transformer, to the fan relay to provide rectified current to the fan relay via diodes D1 and D2. The + and − terminals to the fan relay correspond to terminals AUX1 and AUX2 on the fan control board. When the power to terminals G and C is cut off, the PTC resistor is still hot and must cool to a predetermined temperature before the 1NT contact opens, this providing the time delay in shutting off the fan motor.

Figure 3:
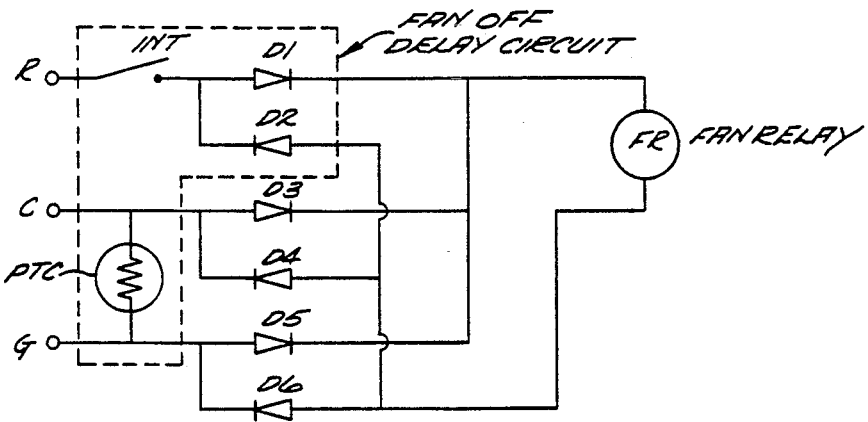
FIG. 3 is a circuit diagram of a time delay relay in accordance with the present invention.

In FIG. 3, the circuitry shown within the dotted line is identical to the circuitry of FIG. 2. In addition, diodes D3, D4, D5 and D6 have been added whereby the current initially applied to the PTC resistor is also full wave rectified and is also applied to the fan relay, thereby turning on the fan motor immediately and prior to heating up of the PTC resistor. This avoids the possibility of the heater elements heating up prior to operation of the fan with possible problems inherent in such operation. The circuit otherwise operates as described above with respect to FIG. 2, the additional circuitry operating to provide instant turn on of the fan motor rather than the delay as in the circuit of FIG. 2. The delay in motor turn off remains.

Referring now to FIG. 4(b), there is shown a schematic diagram of a portion of the fan control board of FIG. 1 wherein components which are not relevant to the invention herein will not be discussed except as required to describe circuit operation. The circuit includes diodes CR1, CR2, CR3 and CR4 which are used to perform rectification of 24 volt AC entering the circuit at pins J2-2 (CFUSED) and J2-1 (G) and drive the coil of the 24 volt single pole double throw DC relay K1. The normally open contact 5 of the relay K1 is coupled to pin J1-7 (ACL2). When relay K1 is energized by signals on the lines G and CFUSED, terminals 4 and 5 of the relay are connected together to energize MOTORL2 line E1 to the fan motor relay. The line EAC2 coupled to line E1 is coupled to an electronic air cleaner. All connections to line J1-9 (ACL1) are common 240 volt AC connections and are coupled to the MOTORL1 line and transformer line TXCOM. The normally closed contact 3 of relay K1 is connected to AC interlock pin J1-11 (ACINTLK) which is connected in common with the first stage electric heater. The purpose of the AC interlock is to turn on the fan motor on MOTORL2 when the first stage heater becomes energized. The fuse 5A is connected to quick connect QC-E8 (signal E) which is a common connection to a 24 volt AC transformer.

The line G becomes energized when the thermostat attempts to turn the fan on to operate the relay K1 and close contact pin 5 thereof. Also, a signal on the line ACINTLK turns on the fan motor via normally closed pin 3 of relay K1 unless the relay has been energized.

The circuitry of FIG. 3 is located at the FAN time delay relay wherein the PTC resistor of FIG. 3 is positioned between the signal lines G and C. The printed circuit jumper "FAN time delay relay" has been removed from the printed wiring board. The common contact of the 1NT is connected to the signal R and the normally open side of the 1NT common contact is connected to the anode of one diode D1 and the cathode of another diode D2. These diodes are then connected to the signals AUX2 (positive side of the fan relay coil) and AUX1 (negative side of the fan relay coil), respectively (FIGS. 1 and 4(b).

In operation, when power is applied to the G and C lines, the fan relay is energized through diodes CR1, CR2, CR3 and CR4. This in turn energizes the fan motor (when the relay contacts close). The PTC resistor of the fan time delay relay is also energized by G and C. When the 1NT common contact has been heated to the correct level, its contacts close. This causes 24 VAC (R) power to be applied to the two diodes located on the fan time delay relay. When power is removed from G, rectified 24 VAC is applied to the fan relay coil through the contacts of the 1NT common contact and through the two diodes located on the fan time delay relay. This condition persists until the PTC resistor cools sufficiently to open the 1NT contacts. Thus, the turn off of the fan relay (and the fan motor) is effectively delayed.

Figure 4A:
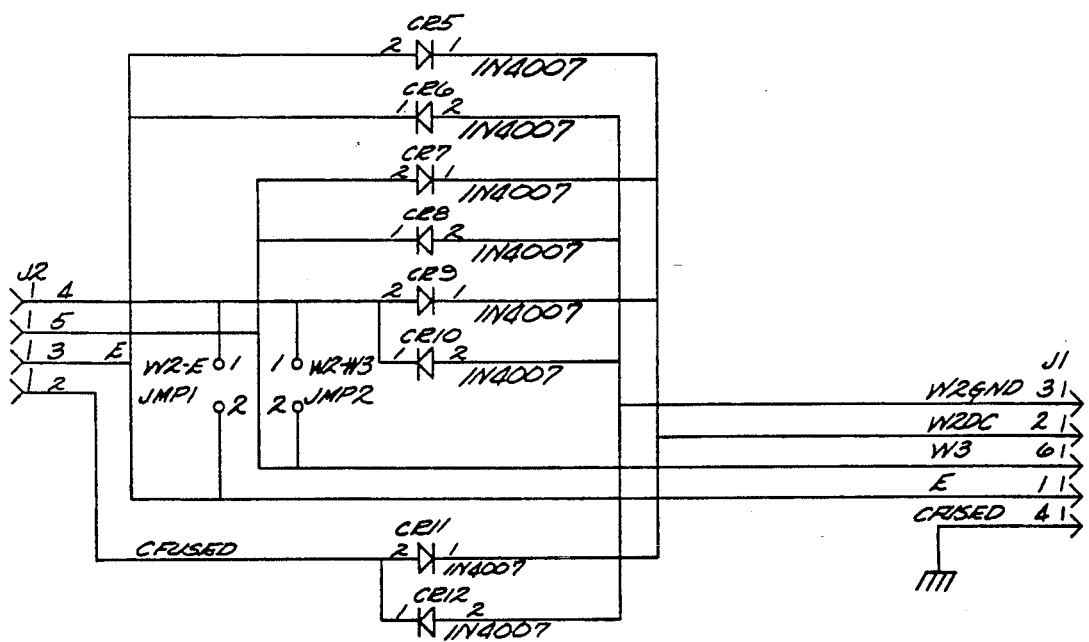
FIGS. 4(a) and 4(b) are circuit diagrams comprising the fan control board of FIG. 1.
Figure 4E:
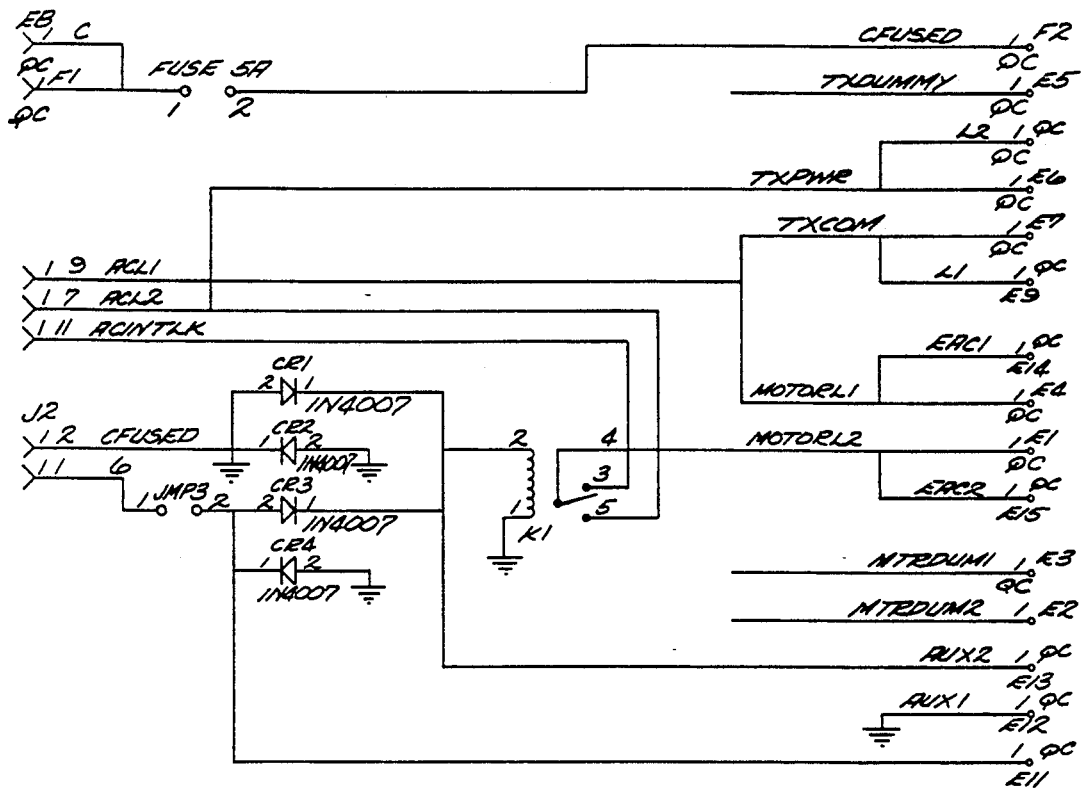

FIG. 4(a) is the diode interlock scheme and provides a safety feature. The installation of time delay relays for heat pumps with auxiliary electric heat or electric furnaces typically requires the time delay relays to be wired so that the first stage of auxiliary heat is energized first and the third stage is energized last (assuming three heating stages in the heater). This further burdens any field installation by requiring that the first stage thermostat wires be connected to the first heating stage time delay relay, second stage thermostat wires be connected to the second stage time delay relay and third stage thermostat wires be connected to the third stage time delay relay. In order to insure that this sequencing remains true, regardless of the thermostat wiring, an interlock relay must be added which insures that the first stage time delay relay has power applied to the coil thereof whenever any of the other stages are energized. This adds safety to the system because the fan motor is thereby energized whenever the first stage heater is energized (i.e., the fan motor will be energized whenever any of the electric heating elements are energized because of time delay relay timing and the interlock relay.)

The schematic diagram of the interlock circuitry is shown in FIG. 4(a) and involves the use of eight diodes (CR5 thru CR12). The diodes are arranged in such a manner that whenever 24 VAC power is applied to line W2 (first stage thermostat wire), line W3 (second stage thermostat wire) or line E (third stage thermostat wire), full wave rectified 24 volts DC power appears between the W2DC and the W2GND (corresponding to GNDDC of FIG. 1) lines. When these two lines are attached to the coil of the first stage time delay relay, an interlock is achieved, such that the first stage will be energized whenever any of the other time delay relay coils are energized. Since the normally closed contact of the fan relay is connected to the first stage electric heater, the fan motor will turn on whenever any of the electric heat stages have been energized. Furthermore, the fan will remain on until the first stage time delay relay contacts open. Thus, the safety feature of the interlock relay is accomplished through the use of the eight diodes. These eight diodes are less expensive and much more reliable than a conventional electromechanical relay. In a multi-stage furnace which has multiple stages of electric heat, it is necessary to wire the control elements for the heaters in the correct order to prevent having an unsafe condition where an electric heater is on with no operating fan motor. The circuit of FIG. 4(a) insures that this unsafe condition cannot occur.

In operation, the signal W2 on pin J2-4 indicates that the first stage of electric heat has been energized. The signal W3 on pin J2-5 indicates that the second stage of electric heat has been energized. The signal E on pin J2-3 indicates that the third stage of electric heat has been energized. Each consecutive stage of the heater is energized to increase the amount of heat provided by the heater. Pin J2-2 is for the CFUSED signal which is the common signal from the transformer after the fuse. The circuit creates a full wave rectified AC signal at pins J1-2 (W2DC) and J1-3 (W2GND) whenever the signal W2, W3 or E becomes energized. As a result, signals W2DC and W2GND are connected in the system to the first stage electric heat time delay relay. Thus, whenever signals W2, W3 or E are energized, at the same instant the first stage electric heat time delay relay (not shown) is energized. After some time delay, the time delay relay will energize the first stage of electric heat. Then power will appear at pin J1-11 (ACINTLK) which goes to the normally closed contact of relay K1 to provide the safety feature.

Figure 5A:
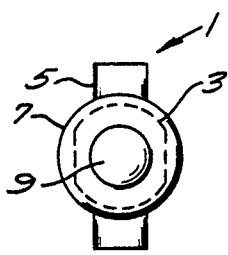
FIGS. 5(a) and 5(b) are end and side views respectively of a thermal delay relay housing in accordance with the present invention.
Figure 5E:
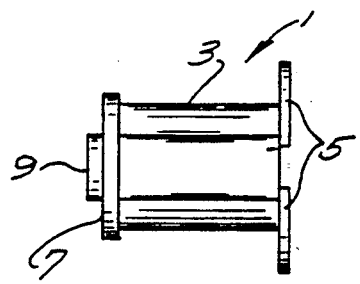

Referring now to FIGS. 5(a) and 5(b), there is shown an external view of a time delay relay in accordance with the present invention with all circuitry within the relay housing (not shown). The relay 1 includes a housing 3 having a rear contact flange 5 corresponding to input R of FIG. 3 and contacts 7 and 9 corresponding to inputs C and G of FIG. 3 at the other end of the housing which are insulated from each other and which connect to opposite terminals of the PTC resistor.

Figure 6A:
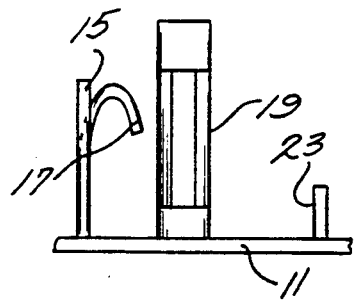
FIGS. 6(a) and 6(b) are side and end view respectively of a quick connect for receiving the thermal delay relay housing of FIGS. 5(a) and 5(b).
Figure 6E:
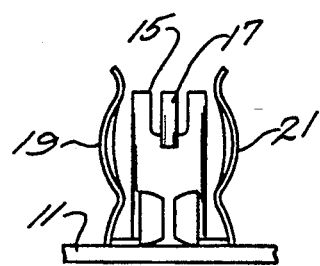

It is often necessary to easily remove the time delay relay for replacement or cleaning. In this regard, the time delay relay of FIGS. 5(a) and 5(b) is mounted in a quick connect as shown in FIG. 6(a) and 6(b) wherein the printed circuit board 11 is the base portion with a first terminal 15 having a resilient finger 17 for frictional coupling to contact 9 of relay and resilient contacts 19 and 21 for resiliently encasing the contact 7 therebetween. A third terminal 23 contacts the contact flange 5. The time delay relay 1 of FIGS. 5(a) and 5(b) Z is easily removed from the quick connect of FIGS. 6(a) and 6(b) by spreading apart the resilient contacts 19 and 21 and withdrawing the relay. The relay 1 is installed by snapping in or forcing the contact 7 between contacts 19 and 21 whereby the contacts 19 and 21 frictionally lock the relay therein.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. A quick connect device comprising:
   (a) a base member, said base member being a printed circuit board;
   (b) a first resilient terminal secured to said base member;
   (c) a pair of opposed second resilient terminals spaced from said first terminal and secured to said base member; and
   (d) a third rigid terminal secured to said base member and disposed on the side of said opposed terminals remote from said first terminal, said first terminal including a resilient finger portion extending toward said third terminal.

2. A device as set forth in claim 1 wherein each of said pair of opposed second resilient terminals includes a central outwardly curved portion.

3. A device as set forth in claim 1, further including a time delay relay having front, central and rear terminals, said rear terminals electrically insulated from each other, said central terminal removably secured in said device by said pair of opposed second resilient terminals and said front and rear terminals frictionally engaging said first and one of said third terminals respectively.

* * * * *